United States Patent
Kuo et al.

(10) Patent No.: US 6,545,468 B2
(45) Date of Patent: Apr. 8, 2003

(54) CALIBRATION METHOD FOR MAGNETICALLY ENHANCED REACTIVE ION ETCHER

(75) Inventors: Hui Ming Kuo, Chiai (TW); Strellson Cheng, Tainan (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 0 days.

(21) Appl. No.: 09/920,913

(22) Filed: Aug. 2, 2001

(65) Prior Publication Data

US 2003/0034773 A1 Feb. 20, 2003

(51) Int. Cl.[7] .................. G01R 33/02; G01R 31/06; H01L 21/66; H05H 1/02; C23F 1/00
(52) U.S. Cl. .................. 324/226; 324/202; 324/260; 324/263; 156/345.49; 204/298.32; 216/59; 438/5; 438/14
(58) Field of Search .................. 324/202, 226, 324/260–263, 546; 438/5, 10, 14, 17; 216/59, 61, 84, 86; 204/298.32, 298.36, 298.37, 298.38; 156/345.42, 345.46, 345.49

(56) References Cited

U.S. PATENT DOCUMENTS

| | | | | |
|---|---|---|---|---|
| 4,492,610 A | * | 1/1985 | Okano et al. | 156/643 |
| 5,132,544 A | * | 7/1992 | Glavish | 250/492.2 |
| 5,242,538 A | * | 9/1993 | Hamrah et al. | 156/643 |
| 5,753,066 A | * | 5/1998 | Kubota et al. | 156/345 |
| 5,880,034 A | * | 3/1999 | Keller | 438/732 |

* cited by examiner

Primary Examiner—Gerard R. Strecker
(74) Attorney, Agent, or Firm—Tung & Associates

(57) ABSTRACT

A method of calibrating the magnetic coils of a magnetically enhanced reactive ion etcher includes taking magnetic field measurements outside of a closed plasma chamber and correlating such measurements to the magnetic field within the chamber. One or more factors are established which when applied to measurements taken externally yield results representative of measurements taken internally.

22 Claims, 3 Drawing Sheets

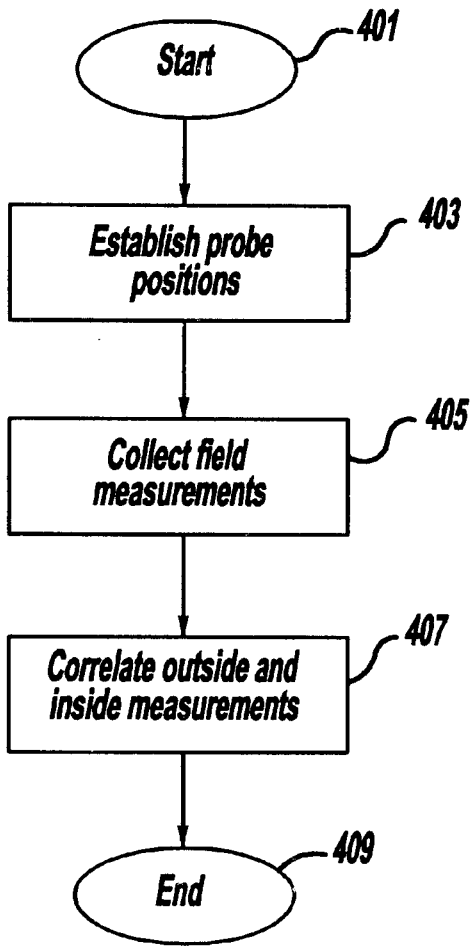
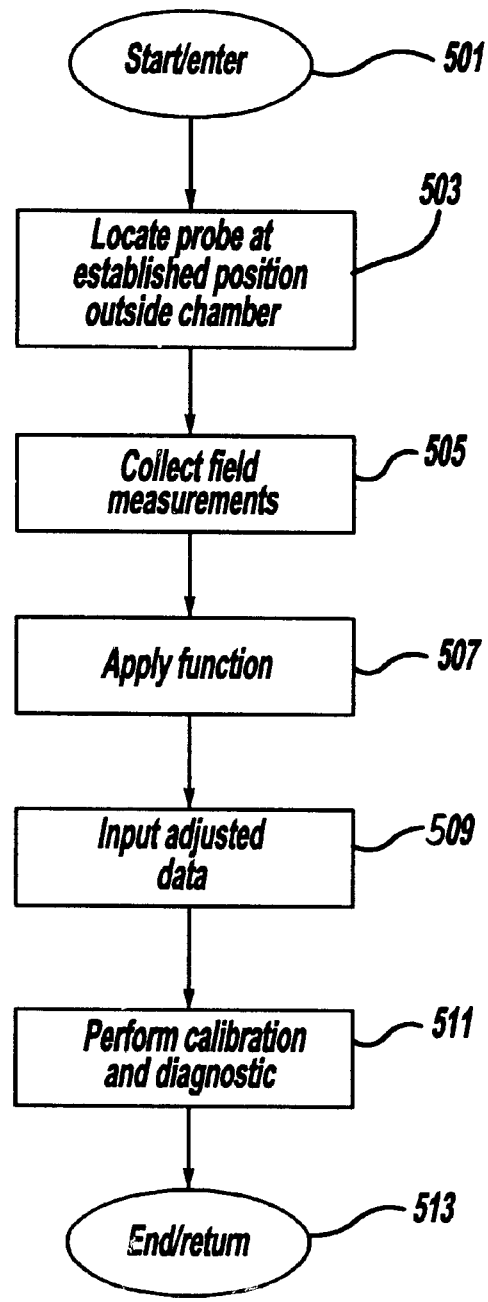
Figure - 4
Figure - 5

US 6,545,468 B2

1

CALIBRATION METHOD FOR MAGNETICALLY ENHANCED REACTIVE ION ETCHER

TECHNICAL FIELD

The present invention is generally related to magnetically enhanced reactive ion etching equipment, and more particularly to the calibration of the magnetic field of such equipment.

BACKGROUND OF THE INVENTION

Reactive ion etchers are used extensively by the microelectronics industry in the manufacturing of semiconductor and silicon based devices. Such devices include, for example, integrated circuits and micro-machined devices. Reactive ion etching is a dry etching process by which undesirable portions of a layer or film of one particular material are removed from a substrate wafer or layer of another material by chemical and/or physical interaction with a plasma etchant. For example, reactive ion etching may be used in conjunction with a mask layer to remove material in one or more layers beneath the mask layer in accordance with a pattern defined by the mask layer. In other words, certain etchants react with and remove the material in the layer or layers beneath the mask layer which are exposed to the etchant. The mask layer is substantially immune to the etchant's effects and remains in place. Additionally, reactive ion etchers are used to remove mask layers while leaving substantially undisturbed the layers below the mask including those portions that may be exposed to the etchant by virtue of the pattern established in the mask layer. Of course, the selection of the etchant, among other factors, will determine the chemical and/or physical reactivity or neutrality of the reactant's effect upon the various layers and mask utilized in any particular process.

Magnetically enhanced reactive ion etchers expose a wafer to a reactive plasma contained within a chamber which is additionally subjected to a controlled magnetic field conventionally provided by electromagnets. As used herein, magnetically enhanced reactive ion etchers include any of a variety of plasma based etchers wherein a controlled magnetic field, also referred to as a B-field, is impressed upon the plasma to control various plasma characteristics such as temperature, plasma uniformity and ion-bombardment energy. Process optimization therefore requires a repeatable, controllable B-field.

In FIG. 1 a typical reactive ion etching apparatus 100 is illustrated. Such an apparatus includes central plasma chamber 2 and a plurality of magnetic drive coils 10a, 10b, 12a and 12b symmetrically surrounding the chamber 2. Each coil is oriented orthogonally with respect to the two immediately adjacent coils such that the magnetic field passing through the center of each coil is substantially orthogonal to the magnetic field passing through the center of each immediately adjacent coil. Opposing coil pairs are established by the two sets of non-adjacent coils 10a, 10b and 12a, 12b. Wafers are passed into the chamber through the center of coil 12b and valve slit 6.

Turning to FIG. 2, an exemplary sectional view taken through opposing coil pair 11a, 11b is illustrated. The magnetically enhanced reactive ion etching apparatus 200 in this figure is illustrated without a chamber lid in place, which would be conventional when service maintenance such as wet cleaning, kit changes or magnetic calibration is

2 being performed. Illustration of a conventional lid assembly 60 is shown in FIG. 3. In the present illustration, access to chamber liner 31 through the lid opening 32 at the top of the apparatus 200 is required for magnetic probe tool 50 conventionally utilized in taking magnetic field measurements during chamber calibration.

Chamber walls 30 which are manufactured from a non-magnetic material such as aluminum generally define the plasma chamber liner 31. Within the chamber is cathode 20, which during process operation is subjected to an RF signal by generator 41. Electrostatic chuck 22 is attached to cathode 20 and is employed for holding a semiconductor wafer in a reaction plasma chamber with a high level of accuracy during semiconductor processing.

Calibration tool 40 comprises a base portion 44 defining a locating feature 46 for accepting magnetic probe tool 50 including element 52. Element 52 may for example be a Hall device. Calibration tool 40 also includes standoff legs 42 which locate the tool to electrostatic chuck 22 at the desired height and orientation. With tool 40 properly located, a controlled location for probe tool 50 is established and the measurements of the magnetic fields generated by the coils will be repeatable.

Calibration of the apparatus 200 requires accurate measurements by the magnetic probe 50 of the magnetic field generated by each coil. Calibration of the coils may be required for example upon process changes requiring kit swapping or for such reasons as replacement of a coil driver or loss of data due to controller hard disk failures. In the former scenario, it is generally conventional practice to open the chamber and perform a variety of maintenance operations prior to releasing the apparatus for production use in the manufacturing environment. This includes venting of the chamber, removal of the chamber lid, gas distribution plate and all process kits. A wet cleaning of the chamber, lid and gas distribution plate as well as other ancillary maintenance operations are performed. This maintenance can take significant time and manpower resources. Eight to twelve hours of apparatus down time is common. In the latter scenarios, the same maintenance operations must be performed in conjunction with the conventional invasive calibration method. It is, however, generally desirable to avoid such otherwise unnecessary process steps.

As mentioned, calibration of the chamber magnetic field requires measurement of the magnetic field. This is accomplished by providing each coil in turn with a known DC drive voltage or current and taking a measurement of the magnetic field by the probe 50 via line 53. The known voltage or current can be applied to the coils manually by way of controlled voltage or current sources or automatically through coil drivers 70, 71 which control the voltage or current to coils 11a and 11b, respectively. Each coil driver 70, 71 respond to external input signals 72, 73, respectively, such as a commanded voltage or current level from a process controller (not shown). The process controller may take many forms, for example a dedicated microprocessor based process controller with operator interface allowing voltage and current level selections during a calibration routine, or a general purpose PC based process controller with conventional keyboard/mouse operator interfaces also providing for voltage and current level selections during a calibration routine. Data corresponding to the generated magnetic field vector is collected for each coil. If a manual process is followed, data may be read by an operator from a data acquisition display of a device interfaced with the probe 50. The manually read data is input to the process controller such as may be requested during a calibration routine executed by the controller. The process controller may also be adapted to automate the calibration process through data acquisition circuitry for monitoring and processing the signal from probe 50 element 52 during the calibration process via line 53.

It may be desirable to take readings of the magnetic field of each coil for both phases of coil excitation. That is to say one reading at a positive DC voltage and current and one reading at a negative DC voltage and current. An average of the absolute value of the two readings or an aggregate of the absolute value of the two readings may then be used in the further steps of the calibration process. Also, multiple readings for each coil taken at different voltage or current magnitudes may be taken depending upon the granularity of the calibration method employed by the process controller. In summary, magnetic field measurements would be taken in accordance with the methodology set forth by the process equipment manufacturer.

The magnetic field measurements provide information regarding the absolute and relative performance of each coil of the process apparatus. Measurements of any one coil that is substantially different from an expected reading may be evidence of a faulty coil or coil driver. Expected values for the magnetic field readings are generally provided by the manufacturer of the plasma etching apparatus and are accurate for a given orientation of the magnetic probe such as is established with the calibration tool previously described. Assuming the magnetic field measurements for the coils fall within acceptable ranges, the process controller utilizes the data to normalize the response of the system to a desired response. This may be accomplished for example by applying a function, weight, adjustment factor or other trimming function to a base input signal of the respective coil drivers. Generally it is desirable to normalize the magnetic field of each coil such that equivalent independent fields would be generated. The precise method of calibration is not critical to the invention but it suffices to say that the drive voltage or current of each coil drive would be commanded in accordance with the desired system response by virtue of the calibration.

SUMMARY OF THE INVENTION

Therefore, it is one object of the invention to provide a non-invasive method of calibrating the magnetic field of a plasma chamber.

It is a further object to provide a non-invasive method of determining the magnetic field within a plasma chamber.

In accordance with the present invention, a reactive ion etcher is provided having a plasma chamber surrounded by magnetic coils. Through a series of measurements of magnetic field strength at a first predetermined location substantially on the chamber lid and a corresponding series of measurements of magnetic field strength at a second predetermined location within the chamber, the external magnetic field is correlated to the internal magnetic field to establish a function which when applied to external magnetic field measurements taken at the first predetermined location yields the magnetic field inside the chamber at the second predetermined location. This indirect measurement of the magnetic field inside the chamber is then utilized in a calibration routine for establishing the response of the magnetic field drivers.

BRIEF DESCRIPTION OF THE DRAWINGS

The present invention will now be described, by way of example, with reference to the accompanying drawings, in which:

FIG. 4 is a flow diagram illustrating steps to establish the correlation between magnetic field measurements taken outside and inside a plasma; and, FIG. 5 is a flow diagram illustrating steps to apply the correlation established between magnetic field measurements taken outside and inside a plasma in a calibration of the plasma chamber magnetic coils.

DESCRIPTION OF THE PREFERRED EMBODIMENT

According to the present invention, calibration of a magnetically enhanced reactive ion etcher is accomplished in a non-invasive manner. Unless independent necessity dictates that the plasma chamber needs to be opened, the present invention provides for magnetic field measurements to be taken outside of the plasma chamber. Thus, venting of the chamber, removal of the chamber lid, gas distribution plate and process kit is avoided. Similarly, unnecessary wet cleaning of the chamber, lid and gas distribution plate as well as other ancillary maintenance required when the plasma chamber is opened and compromised is avoided.

Figure 1:
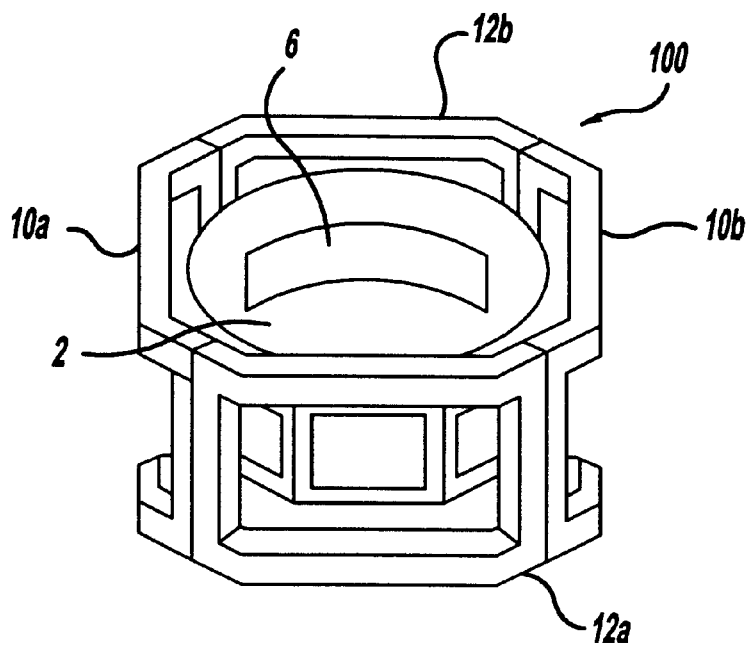
FIG. 1 is a diagram of portions of a typical reactive ion etching chamber including plasma chamber and magnetic drive coils.
Figure 3:
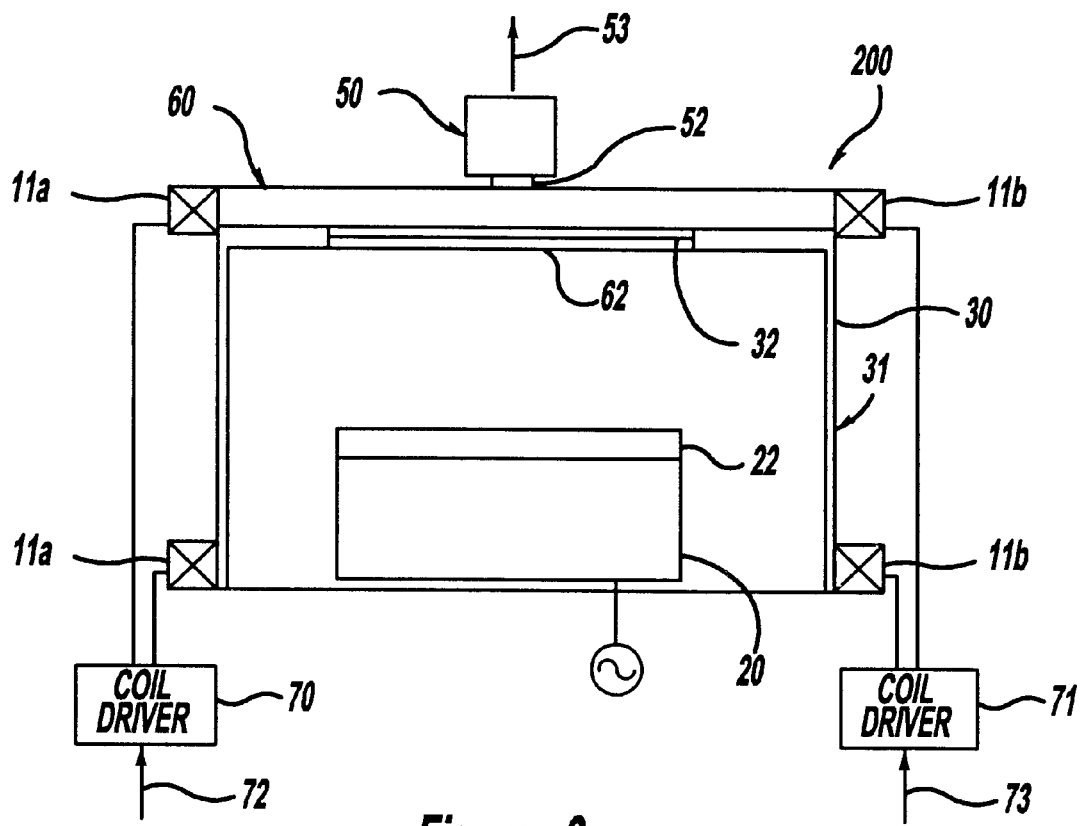
FIG. 3 is a section schematic of a reactive ion etching system set-up suitable for magnetic field calibration according to the present invention.
Figure 2:
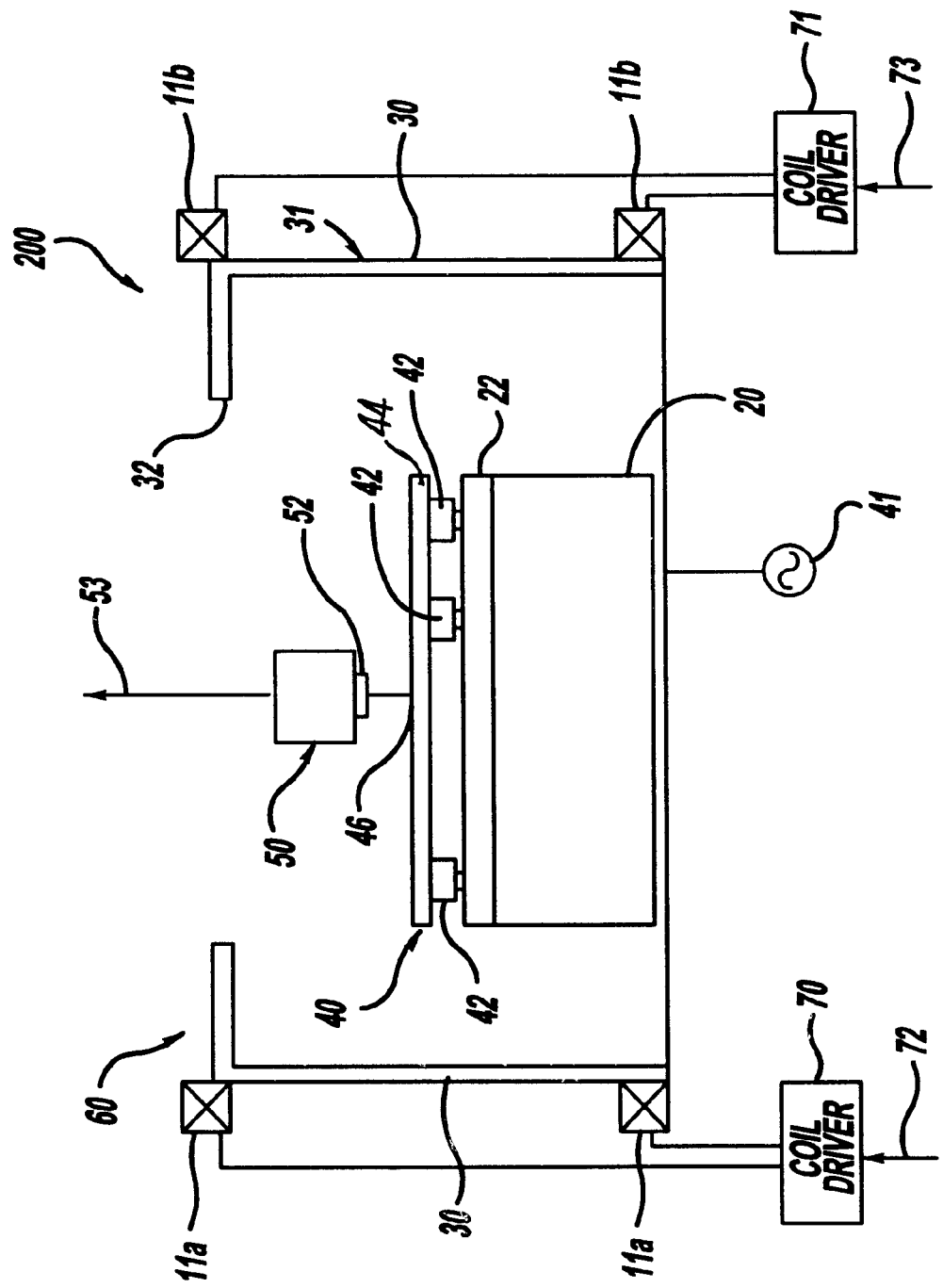
FIGS. 2 is a section schematic of a reactive ion etching system set-up suitable for conventional magnetic field calibration.

With further reference now to FIG. 3, a magnetically enhanced reactive ion etching apparatus 200, identical in all respects to the apparatus illustrated in FIG. 2, is additionally shown with the lid assembly 60 in place. Lid assembly 60 includes gas distribution plate 62 through which process gas flows. All other features illustrated in FIG. 3 correspond to the same numbered features illustrated in and described with respect to FIG. 2. Repetition of description of such common features as between FIGS. 2 and 3 is therefore not undertaken herein.

It is noted that FIG. 3, as distinct from FIG. 2, illustrates a calibration set-up in accordance with the present invention. While the calibration set-up illustrated in FIG. 2 has such features or characteristics as (a) an open chamber (lid open or removed), (b) calibration tool 40, and (c) magnetic probe 50 indexed to calibration tool 40 locating feature 46, the calibration set-up illustrated in FIG. 3 avoids such disadvantageous features and characteristics. To wit, the set-up of FIG. 3 advantageously leaves the lid assembly 60 in place thus maintaining the integrity of the plasma chamber, requires no intrusion into the plasma chamber by a calibration tool or magnetic probe thereby avoiding the significant penalties associated with an intrusive calibration set-up previously described.

The set-up of FIG. 3 merely requires a repeatable placement of the magnetic probe 50 relative to the apparatus 200. Preferably, that placement is at a place above the lid assembly with a further preference that it be substantially immediately adjacent the lid assembly 60, though spaced adjacencies are acceptable, and relatively central to the placement of the coils surrounding the chamber. Such preferred placement would therefore place the probe in contact with the lid assembly such that the probe is equidistant from each coil of an opposing coil pair or symmetrically located with respect to all coils. Repeatable location of the probe may be accomplished by locating the probe within a footprint marking of the preferred location or within mounting features or fixturing machined into or added onto (removably or permanently) the lid assembly.

It has been discovered that such repeatable set-ups allow for magnetic field measurements taken otherwise as described with respect to the set-up of FIG. 2 to merely be adjusted by a factor and then used directly in the remainder of the calibration routine. That is to say, a weighting of the magnetic field measurements taken in accordance with the set-up of FIG. 3 returns a product which is substantially equivalent to a corresponding measurement if taken in accordance with the set-up of FIG. 2. These factors or weights may be derived experimentally with relatively little effort and are generally represented by a ratio of the magnetic field measurements taken in accordance with the respective set-ups as generally exemplified in FIGS. 2 and 3.

Tables I through VI below represent six sets of magnetic field measurement data. Each table shows one group of data corresponding to measurements taken inside a chamber and one group of measurements taken outside a chamber in accordance with the teachings herein. All magnetic field data measurements are in gauss. All tables represent magnetic field data measurements collected from production use Applied Materials® Centura® platform chambers. The specific chamber type appears at the top of the table.

Table I represents measurements taken on one Super-e chamber while Table II represents the same type of measurements on a different Super-e chamber. Similarly, Table III represents measurements taken on one eMxP+ chamber while Table IV represents the same type of measurements on a different eMxP+ chamber. And, Table V represents measurements taken on one MxP chamber while Table VI represents the same type of measurements on a different MxP chamber.

For Tables I and II, it can be seen that magnetic field data corresponding to both polarities of coil setting voltages (+/−) at magnitudes of 2.5V and 5V were collected. This is so because the manufacturer's software screens for the Super-e chamber requires magnetic field data in such a manner. From analysis of Table I, the data collected outside the chamber are seen to bear a repeatable relationship to the data collected inside the chamber. An average ratio of the outside chamber measurements to the coil inside chamber measurements is substantially 0.55, and this result is substantially consistent with individual measurement ratios. For example, for a −2.5 V coil setting, the ratio of the coil 2 outside chamber measurement (−13.3) to the coil 2 inside chamber measurement (−24.4) is substantially 0.55 (within +/−10% thereof). Similarly, for a 5V coil setting, the ratio of the coil 1 outside chamber measurement (25) to the coil 1 inside chamber measurement (45.5) is also substantially 0.55. Other similar comparative pairs of measurements for the remaining data yield similar repeatability for the same chamber.

TABLE I

Chamber Type: Super-e    Chamber Number: 1

| | | Coil Setting → | | | |
|---|---|---|---|---|---|
| | | −2.5 V | 2.5 V | −5 V | 5 V |
| Magnetic Field Inside Chamber | Coil 1 | −22.8 | 22.8 | −45.6 | 45.5 |
| | Coil 2 | −24.4 | 24.7 | −50.2 | 50.1 |
| | Coil 3 | −22.8 | 22 | −48.9 | 48.8 |
| | Coil 4 | −25.5 | 25.3 | −50.5 | 49.5 |

TABLE I-continued

Chamber Type: Super-e    Chamber Number: 1

| | | Coil Setting → | | | |
|---|---|---|---|---|---|
| | | −2.5 V | 2.5 V | −5 V | 5 V |
| Magnetic Field Outside Chamber | Coil 1 | −12.4 | 12.4 | −24.7 | 25 |
| | Coil 2 | −13.3 | 13.4 | −26.5 | 27.4 |
| | Coil 3 | −13.4 | 13.5 | −27 | 26.8 |
| | Coil 4 | −13.8 | 13.8 | −27.5 | 27.3 |

Chamber to chamber repeatability for substantially equivalent chamber types is borne out by analysis of similar comparative pairs of measurements for different chambers. For the present example using Super-e chambers, Table II illustrates that the exemplary underlined pairs of measurements also confirm a ratio of outside chamber measurement to inside chamber measurement of substantially 0.55. This ratio of outside to inside measurements may therefore be utilized as a weight or factor to derive or estimate inside chamber measurements from outside chamber measurements.

TABLE II

Chamber Type: Super-e    Chamber Number: 2

| | | Coil Setting → | | | |
|---|---|---|---|---|---|
| | | −2.5 V | 2.5 V | −5 V | 5 V |
| Magnetic Field Inside Chamber | Coil 1 | −23 | 24 | −46.5 | 47.4 |
| | Coil 2 | −25.1 | 24.8 | −49.6 | 49.5 |
| | Coil 3 | −23.6 | 23.4 | −48.3 | 47.1 |
| | Coil 4 | −24.4 | 25.3 | −49.3 | 50.2 |
| Magnetic Field Outside Chamber | Coil 1 | −12.6 | 13.1 | −25.6 | 26.1 |
| | Coil 2 | −13.8 | 13.6 | −27.3 | 27.2 |
| | Coil 3 | −12.98 | 12.9 | −26.5 | 25.9 |
| | Coil 4 | −13.4 | 13.9 | −27.1 | 27.7 |

To validate the general applicability of the discovered repeatable correspondence between inside chamber and outside chamber measurements, different chamber types were also subjected to data collection and analysis of a similar variety. For example, for Tables III and IV, it can be seen that magnetic field data corresponding to coil voltage settings of 2.5V, 5V, 7.5V and 10V were collected. In the case of this second type of chamber, a eMxP+chamber, the opposing coil pairs were energized simultaneously thus yielding side-to-side measurements and front-to-back measurements in contrast to individual coil measurements as in the previous example with respect to the Super-e chamber. This is so because the manufacturer's software screens for the eMxP+ chamber requires magnetic field data in such a manner. From analysis of Table III, the data collected outside the chamber is seen to bear a repeatable relationship to the data collected inside the chamber. An average ratio of the outside chamber measurements to the inside chamber measurements is substantially 0.55, and this result is substantially consistent with individual measurement ratios. For a 2.5 V coil setting, the ratio of the front-to-back outside chamber measurement (25.8) to the front-to-back inside chamber measurement (46.5) is substantially 0.55. Similarly, for a 10V coil setting, the ratio of the side-to-side outside chamber measurement (108.4) to the side-to-side inside chamber measurement (194) is also substantially 0.55. Here, too, similar comparative pairs of measurements for the remaining data yield similar repeatability for the same chamber.

TABLE III

Chamber Type: eMxP+    Chamber Number: 3

| | | Coil Setting → | | | |
|---|---|---|---|---|---|
| | | 2.5 V | 5 V | 7.5 V | 10 V |
| Magnetic Field Inside Chamber | Side-to-side | 50.2 | 100.2 | 147. | <u>194</u> |
| | Front-to-back | <u>46.5</u> | 95.3 | 141. | 186 |
| Magnetic Field Outside Chamber | Side-to-side | 27.5 | 55.8 | 83.5 | <u>108.4</u> |
| | Front-to-back | <u>25.8</u> | 52.5 | 78.5 | 101.5 |

Chamber to chamber repeatability is borne out by analysis of similar comparative pairs of measurements for different chambers of the same chamber type. For the present example using eMxP+chambers, Table IV illustrates that the underlined pairs of measurements also confirms a ratio of outside chamber measurement to inside chamber measurement of substantially 0.55.

TABLE IV

Chamber Type: eMxP+    Chamber Number: 4

| | | Coil Setting → | | | |
|---|---|---|---|---|---|
| | | 2.5 V | 5 V | 7.5 V | 10 V |
| Magnetic Field Inside Chamber | Side-to-side | 50.2 | 100.2 | 147.4 | <u>194</u> |
| | Front-to-back | <u>46.5</u> | 95.3 | 141.1 | 186 |
| Magnetic Field Outside Chamber | Side-to-side | 27.8 | 55.6 | 81.8 | <u>107.6</u> |
| | Front-to-back | <u>25.8</u> | 52.8 | 78.3 | 103.2 |

As further validation of the general applicability of the discovered repeatable correspondence between inside chamber and outside chamber measurements, yet another set of different chamber types were subjected to data collection and analysis of a similar variety. Tables V and VI show magnetic field data corresponding to coil voltage settings of 2.5V, 5V, 7.5V and 10V were collected. In the case of this third type of chamber, a MxP chamber, the opposing coil pairs were, similar to the eMxP+chamber, energized simultaneously yielding side-to-side measurements and front-to-back measurements in contrast to individual coil measurements as in the twice removed example with respect to the Super-e chamber. Again, the manufacturer's software screens' data requirements defined the manner and type of magnetic field measurements. From analysis of Table V, the data collected outside the chamber is seen to bear a repeatable relationship to the data collected inside the chamber. An average ratio of the outside chamber measurements to the inside chamber measurements is substantially 0.48, and this result is substantially consistent with individual measurement ratios. For a 2.5 V coil setting, the ratio of the front-to-back outside chamber measurement (21) to the front-to-back inside chamber measurement (44) is substantially 0.48. Similarly, for a 10V coil setting, the ratio of the side-to-side outside chamber measurement (92) to the side-to-side inside chamber measurement (193) is also substantially 0.48. Here, too, similar comparative pairs of measurements for the remaining data yield similar repeatability for the same chamber.

TABLE V

Chamber Type: MxP    Chamber Number: 5

| | | Coil Setting → | | | |
|---|---|---|---|---|---|
| | | 2.5 V | 5 V | 7.5 V | 10 V |
| Magnetic Field Inside Chamber | Side-to-side | 46.5 | 98.2 | 147.6 | <u>193</u> |
| | Front-to-back | <u>44</u> | 94 | 141 | 186 |
| Magnetic Field Outside Chamber | Side-to-side | 22.2 | 46.7 | 70 | <u>92</u> |
| | Front-to-back | <u>21</u> | 45 | 67.1 | 88.5 |

Once again, chamber to chamber repeatability is borne out by analysis of similar comparative pairs of measurements taken from a different chamber of the same chamber type. For the present example using MxP chambers, Table VI illustrates that the underlined pairs of measurements also confirm a ratio of outside chamber measurement to inside chamber measurement of substantially 0.48.

TABLE VI

Chamber Type: MxP Chamber Number: 6

| | | Coil Setting → | | | |
|---|---|---|---|---|---|
| | | 2.5 V | 5 V | 7.5 V | 10 V |
| Magnetic Field Inside Chamber | Side-to-side | <u>45.9</u> | 99 | 145.3 | 192 |
| | Front-to-back | 46.2 | 93.6 | 136.5 | <u>180</u> |
| Magnetic Field Outside Chamber | Side-to-side | <u>21.8</u> | 47.1 | 69.1 | 91.4 |
| | Front-to-back | 21.9 | 44.5 | 65 | <u>85.6</u> |

The steps to establishing the correlation between the outside and inside measurements having been described in detail will now be summarized in conjunction with the flow diagram of FIG. 4, and the application of such correlation described in conjunction with the flow diagram of FIG. 5.

Turning to FIG. 4, the flow diagram begins at step 401. First, a position is established for the magnetic probe (403). Internal chamber measurements conventionally require use of a calibration tool previously described for repeatably locating the probe. External chamber measurements requires establishing a similarly repeatable location for the probe. As described earlier, This is preferably on the outer lid surface and central with respect to each respective opposing coil pairs. For repeatability a visual footprint may be established to indicate the desired placement or some type of locating, attachment, or robotic placement may be affected so that subsequent calibrations of the chamber magnetic field can be repeated using the weights or factors once determined. Data is then collected (405) in accordance with the manufacturer's or calibration routine's requirements. For example, if the manufacturer's software screens requires measurements for each coil at four drive voltages for entry into the calibration screen then the data collection should be accomplished in the manner to meet such requirements. Internal measurements are taken in accordance with the internal placement of the probe and external measurements are taken in accordance with the external placement of the probe. Next, the inside measurements are correlated to the outside measurement to establish the relationship there between and provide a function, factor or weight which when applied to outside measurements yield results which would be obtained if the same measurements had been taken inside the chamber (407). Step 409 marks the end of the steps to establishing the correlation between the outside and inside measurements.

The flow diagram illustrated in FIG. 5 represents the manner of utilizing the correlation established in the steps of the flow diagram illustrated in FIG. 4. Step 501 starts the process. Step 503 requires the operator to locate the probe to the repeatable location established outside of the chamber whereat measurements are to be taken. Magnetic field measurements are then taken outside the chamber just as described in step 405 of FIG. 4. The function, factor or weight established for the chamber in the correlation steps previously described is then applied to the measurements taken in step 505. This yields adjusted data which correspond to magnetic field measurements which would have resulted had the measurements been taken within the chamber. These data are then input, such as by manual entry to the manufacturer's software screen, into a calibration routine (509). Step 511 represents the performance of the calibration routine which establishes the appropriate voltage or current required to drive each coil to a desired magnetic field in a manufacturing process. Step 513 marks the end of the steps of the flow diagram.

The invention has been described as establishing a single function, factor or weight for generally applicability to all magnetic measurements taken outside the chamber. However, it is envisioned that multiple such functions, factors or weights may be applied individually to certain magnetic field measurements to achieve the desired correlation results. For example, asymmetric probe positions (with respect to magnetic coils) may be required where chamber lid geometries or other apparatus features do not allow symmetric placements thereby resulting in functions, factors or weights that differ substantially from one coil measurement to the next. When used herein, the terms factor, weight or function are understood as equivalent in as much as each, when applied to outside measurements, returns or yields a result that is substantially equivalent to corresponding measurements which would result if taken inside the chamber.

The invention has been described with respect to a preferred embodiment intened to be taken by way of example and not by way of limitation. Certain alternative implementations and modifications may be apparent to one exercising ordinary skill in the art. Therefore, the scope of invention as disclosed herein is to be limited only with respect to the appended claims.

The embodiments of the invention in which an exclusive property or privilege is claimed are defined as follows.

What is claimed is:

1. A method for calibrating the magnetic field of a magnetically enhanced reactive ion etching system including a plasma chamber, a plurality of magnetic coils and drivers therefor, and a controller having a calibration routine adapted to receive magnetic field data representative of magnetic fields generated within the plasma chamber corresponding to predetermined magnetic coil driver commands, the method comprising the steps:

measuring external magnetic fields at a predetermined location external to the plasma chamber generated by at least one of said plurality of magnetic coils in accordance with the predetermined magnetic coil driver commands;

determining in-chamber magnetic fields from said external magnetic fields; and providing the in-chamber magnetic fields as data to said calibration routine.

2. The method as claimed in claim 1 wherein determining the in-chamber magnetic fields includes calculating the in-chamber magnetic fields as a predetermined function of the external magnetic fields.

3. The method as claimed in claim 2 wherein the predetermined function correlates external magnetic fields to in-chamber magnetic fields.

4. The method as claimed in claim 2 wherein the predetermined function is established by:

energizing at least one of the plurality of magnetic coils with a predetermined magnetic coil driver command to establish a magnetic field;

measuring a first magnetic field with a magnetic field measurement tool at the predetermined location external to the plasma chamber;

measuring a second magnetic field at a predetermined location internal to the plasma chamber; and determining a relationship between the first magnetic field and the second magnetic field which when applied to external magnetic fields yields the in-chamber magnetic field.

5. The method as claimed in claim 4 wherein the predetermined location external to the plasma chamber is substantially adjacent a lid of the chamber.

6. The method as claimed in claim 4 wherein the predetermined location internal to the plasma chamber is established by a calibration tool.

7. The method as claimed in claim 5 wherein the predetermined location external to the plasma chamber is substantially symmetrically located with respect to the plurality of magnetic coils.

8. The method as claimed in claim 4 wherein the predetermined location external to the plasma chamber comprises a mounting feature located on a lid of the chamber.

9. A non-invasive method for determining an in-chamber magnetic field of a magnetically enhanced reactive ion etcher including a plasma chamber and a plurality of selectively energizable magnetic coils, the method comprising the steps:

orienting a magnetic field measurement tool at a predetermined location outside the plasma chamber;

energizing at least one of the plurality of magnetic coils;

measuring an external magnetic field at said predetermined location outside the plasma chamber; and determining the in-chamber magnetic field as a function of the external magnetic field.

10. The method as claimed in claim 9 wherein the function of the external magnetic field is established by:

energizing at least one of the plurality of selectively energizable magnetic coils with a predetermined magnetic coil driver command to establish a magnetic field;

measuring a first magnetic field with a magnetic field measurement tool at the predetermined location outside the plasma chamber;

measuring a second magnetic field at a predetermined location inside the plasma chamber; and determining a relationship between the first magnetic field and the second magnetic field which when applied to external magnetic fields yields the in-chamber magnetic field.

11. The method as claimed in claim 9 wherein determining the in-chamber magnetic field as a function of the external magnetic field includes applying a predetermined factor to the external magnetic field.

12. The method as claimed in claim 9 wherein said predetermined location comprises an external surface of the chamber.

13. The method as claimed in claim 12 wherein said external surface of the chamber comprises a lid on the chamber.

14. The method of claim 9 wherein the magnetic field measurement tool comprises a gauss meter.

15. The method of claim 9 wherein the in-chamber magnetic field corresponds to a known calibration location within the plasma chamber.

16. The method of claim 9 wherein determining the in-chamber magnetic field as a function of the external magnetic field includes determining a correlation between magnetic fields at the predetermined location outside the plasma chamber and magnetic fields at a predetermined location inside the plasma chamber.

17. A non-invasive method for calibrating a magnetic field of a magnetically enhanced reactive ion etcher having a plasma chamber, a plurality of controllable magnetic coils for establishing the magnetic field, and a controller adapted to accept in-chamber magnetic field measurements for use in a self-calibration routine executed by the controller, the improvement comprising:

taking an external magnetic field measurement outside the plasma chamber;

determining the in-chamber magnetic field from the magnetic field measurement outside the plasma chamber; and providing the determined in-chamber magnetic field to the controller for use in the self-calibration routine executed by the controller.

18. The method for calibrating a magnetic field of a magnetically enhanced reactive ion etcher as claimed in claim 17 wherein determining the in-chamber magnetic field includes determining a correlation between magnetic fields outside of the plasma chamber and magnetic fields inside the plasma chamber.

19. The method for calibrating a magnetic field of a magnetically enhanced reactive ion etcher as claimed in claim 17 wherein determining the in-chamber magnetic field comprises determining a correlation between magnetic fields outside of the plasma chamber and magnetic fields inside the plasma chamber and calculating the in-chamber magnetic field as a function of the correlation.

20. The method for calibrating a magnetic field of a magnetically enhanced reactive ion etcher as claimed in claim 17 wherein the external magnetic field measurement is taken at a predetermined location outside the chamber.

21. The method for calibrating a magnetic field of a magnetically enhanced reactive ion etcher as claimed in claim 17 wherein the in-chamber magnetic field is determined with respect to a predetermined location inside the chamber.

22. The method for calibrating a magnetic field of a magnetically enhanced reactive ion etcher as claimed in claim 18 wherein determining the in-chamber magnetic field includes calculating the in-chamber magnetic field as a function of the correlation.

* * * * *